(12) United States Patent
Steranka et al.

(10) Patent No.: US 6,730,940 B1
(45) Date of Patent: May 4, 2004

(54) ENHANCED BRIGHTNESS LIGHT EMITTING DEVICE SPOT EMITTER

(75) Inventors: Frank M. Steranka, San Jose, CA (US); Daniel A. Steigerwald, Cupertino, CA (US); Matthijs H. Keuper, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/283,737

(22) Filed: Oct. 29, 2002

(51) Int. Cl.[7] ............................................... H01L 33/00
(52) U.S. Cl. .......................................... 257/98; 257/99
(58) Field of Search ............................ 257/98, 99, 741

(56) References Cited

U.S. PATENT DOCUMENTS

| | | | | |
|---|---|---|---|---|
| 3,877,052 A | * | 4/1975 | Dixon et al. | 257/98 |
| 3,968,564 A | * | 7/1976 | Springthorpe | 257/98 |
| 6,229,160 B1 | | 5/2001 | Krames et al. | 257/94 |
| 6,323,063 B2 | | 11/2001 | Krames et al. | 438/116 |

FOREIGN PATENT DOCUMENTS

JP 2-39578 * 2/1990 .................. 257/98

* cited by examiner

Primary Examiner—Mark Prenty
(74) Attorney, Agent, or Firm—Patent Law Group LLP; Rachel V. Leiterman

(57) ABSTRACT

The amount of usefully captured light in an optical system may be increased by concentrating light in a region where it can be collected by the optical system. A light emitting device may include a substrate and a plurality of semiconductor layers. In some embodiments, a reflective material overlies a portion of the substrate and has an opening through which light exits the device. In some embodiments, reflective material overlies a portion of a surface of the semiconductor layers and has an opening through which light exits the device. In some embodiments, a light emitting device includes a transparent member with a first surface and an exit surface. At least one light emitting diode is disposed on the first surface. The transparent member is shaped such that light emitted from the light emitting diode is directed toward the exit surface.

21 Claims, 9 Drawing Sheets

ENHANCED BRIGHTNESS LIGHT EMITTING DEVICE SPOT EMITTER

BACKGROUND

1. Field of Invention

The present invention relates generally to increasing the brightness of a light emitting diode light source.

2. Description of Related Art

FIG. 1 illustrates a lens 12 transmitting light generated by a light source 10 such as a light emitting diode. A key issue in designing light sources to be used with optical systems comprised of passive optical imaging elements, such as lens 12, is illustrated in FIG. 1. Only light emitted from the source area that is consistent with the optical invariant or etendue of lens 12 can be usefully focused onto the target area 20 (for example, a transparent microdisplay). The etendue of a given optical system is defined as:

$$E = \int\int (\cos \theta) dA d\Omega \qquad (1)$$

where $\theta$ is the angle between the normal to the surface element dA and the centroid of the solid angle element $d\Omega$. Etendue is a geometric property of the optics related to the divergence and cross-sectional area of the beam. The etendue cannot be decreased for if it were, the energy density at the image could exceed that of the source, violating the second law of thermodynamics.

Source 10 may be, for example, a light emitting diode (LED), which emits light in all directions from both the top and side surfaces. As illustrated in FIG. 1, only light 16 emitted from the center of the top surface of source 10 and within the cone accepted by the lens can be focused on the target 20. Light 14 emitted from the sides of light source 10, emitted from the top of source 10 far from lens 12, and emitted near lens 12 but at an angle outside the etendue-limit, is not utilized by lens 12, and is lost. In the case of a light emitting diode light source 10, as the area of source 10 increases, in general the total light emitted from source 10 may also increase. However, the etendue of lens 12 imposes a maximum value on the amount of light flux that an optical system using lens 12 can utilize, regardless of how large light source 10 is made.

There are several ways to increase the amount of usefully captured light in an optical system. First, a lens with a larger diameter 20 may be used. However, as the diameter of a lens increases, the cost of the lens increases. Thus, it is desirable to limit the size of the lenses in an optical system, in order to control the cost.

Second, the light flux per unit area of the light source may be increased. In the case of a light emitting diode light source, the amount of light generated per unit area is generally proportional to the electrical current density in the light generating layers of the device. Thus, the light per unit area may be increased by increasing the current density. However, the efficiency of light emitting diodes usually falls at high current densities due to, for example, heating effects, saturation in the light emitting layers of the charge carriers that recombine to produce light, or the loss of confinement of the charge carriers that recombine to produce light. The loss of light generating efficiency at high current density limits the amount of light generated per unit area that can be created in a light emitting diode.

SUMMARY

In accordance with embodiments of the invention, the amount of usefully captured light in an optical system may be increased by concentrating light in a region where it can be collected by the optical system.

In some embodiments, a light emitting device includes a transparent substrate having a first surface and a second surface opposite the first surface, a region of first conductivity type overlying the first surface of the substrate, an active region overlying the region of first conductivity type, and a region of second conductivity type overlying the active region. A reflective material overlies a portion of the second surface of the substrate and has an opening through which light exits the device. The reflective material may be, for example, a reflective metal, a non-specular paint, or part of an optical structure separated from the substrate by a layer of transparent material. The transparent material may be index-matched to the substrate. A wavelength-converting material may cover the portion of the second surface of the substrate not covered by the reflective material.

In some embodiments, a light emitting device includes a substrate, a plurality of semiconductor layers overlying the substrate, and a contact disposed on a first surface of the plurality of semiconductor layers. Light is extracted from the device through the first surface. A reflective material overlies a portion of the first surface and has an opening through which light exits the device.

In some embodiments, a light emitting device includes a transparent member with a first surface and an exit surface. At least one light emitting diode is disposed on the first surface. The transparent member is shaped such that light emitted from the light emitting diode is directed toward the exit surface. In some embodiments, the transparent member has two surfaces that form a wedge, with the apex of the wedge opposite the exit surface, and two parallel surfaces. LEDs are disposed on the two surfaces that form a wedge, and the two parallel surfaces are coated with reflective material.

DETAILED DESCRIPTION

In accordance with embodiments of the invention, the amount of light captured in an optical system may be increased by directing light from the source into the etendue-limit of the optical system so that it can be captured by the optical system. The light source may be a semiconductor light emitting device such as a light emitting diode. Embodiments of the invention are applicable to semiconductor light emitting devices of various materials systems, including, for example, III–V systems such as III-nitride, III-phosphide, and III-arsenide, and II–VI systems. Further, embodiments of the invention are applicable to any semiconductor light emitting devices where the device layers and substrate are reasonably transparent to light, including devices having both contacts formed on the same side of the device, such as flip-chip and epitaxy-up devices, as well as devices having contacts formed on opposite sides of the device.

Figure 1:
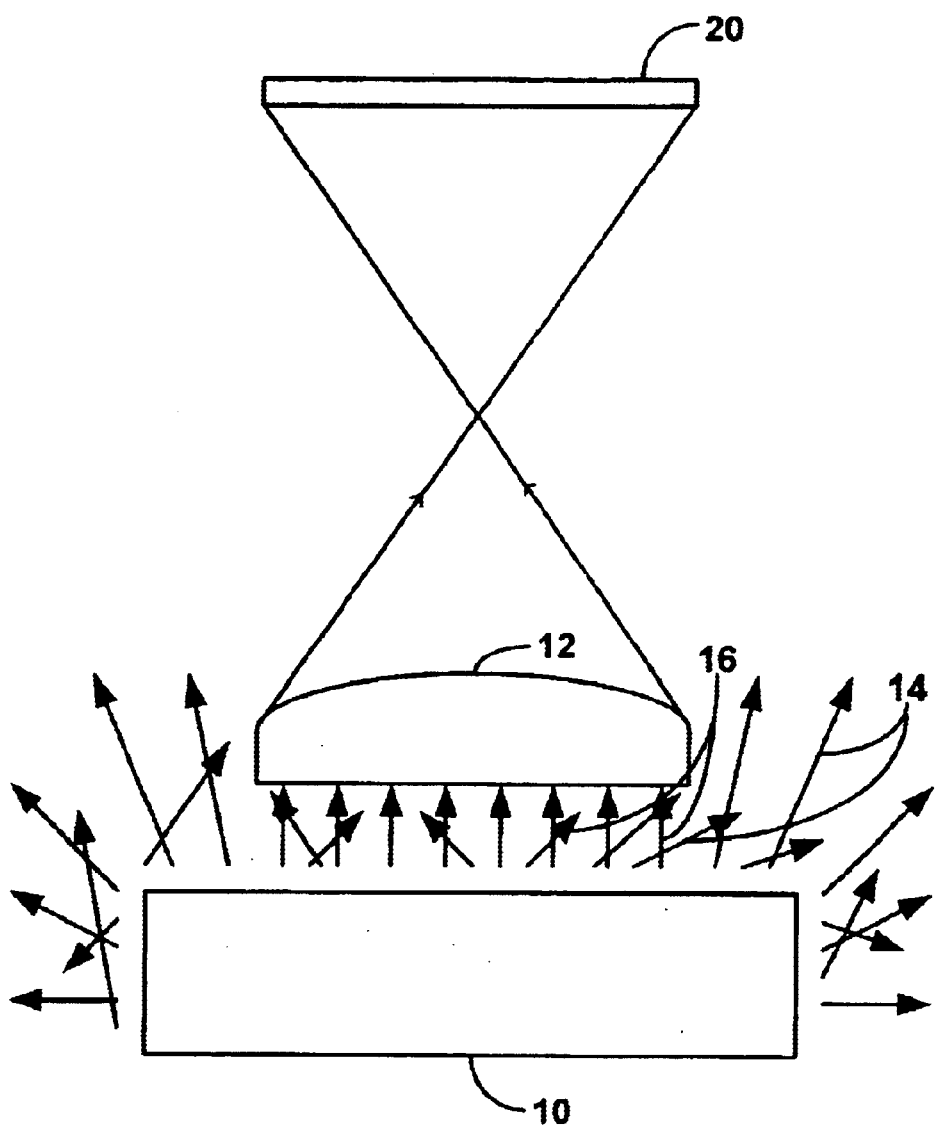
FIG. 1 illustrates an optical system including a light emitting diode, a lens, and a target image area.
Figure 2:
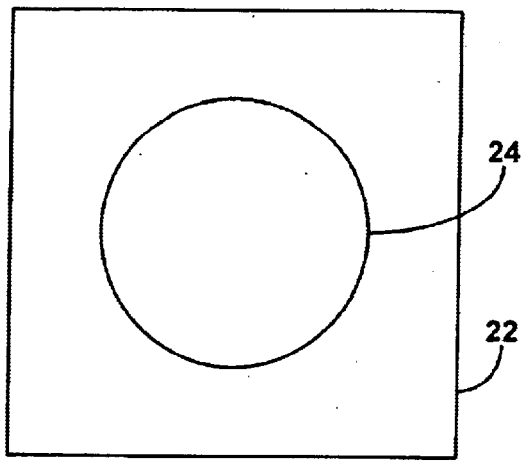
FIG. 2 illustrates a top view of a light emitting device according to embodiments of the present invention.

FIG. 2 illustrates a top view of a light emitting device, the side of the device through which light is extracted and which is often adjacent to optics such as lenses. A portion of the device face illustrated in FIG. 2 is covered by a reflective layer 22. Light only escapes from region 24, which may correspond to the maximum source area consistent with the etendue-limit of a lens in the optical system.

Figure 3:
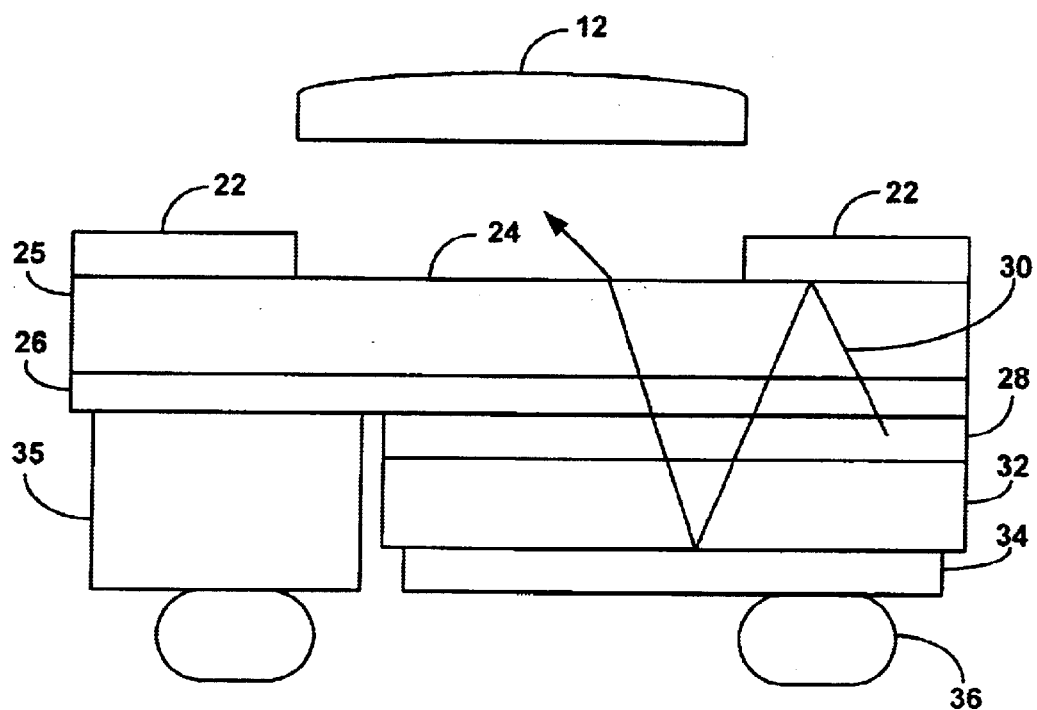
FIG. 3 illustrates a cross sectional view of a light emitting device including a reflective layer, according to an embodiment of the present invention.

FIG. 3 illustrates a cross sectional view of a light emitting device. A layer of first conductivity type 26 is formed on a substrate 25. If the device shown in FIG. 3 is a III-nitride light emitting diode, first conductivity type layer 26 may be an n-type III-nitride layer and substrate 25 may be sapphire, SiC, GaN, or any other suitable substrate. A light emitting region 28, also referred to as the active region, is formed on first conductivity type layer 26, then a layer of second conductivity type 32 is formed on active region 28. A first contact 35 is connected to the layer of first conductivity type and a second contact 34 is connected to the layer of second conductivity type. At least one of contacts 34 and 35 may be reflective. Interconnects 36 connect the light emitting diode to a submount. Interconnects 36 may be, for example, solder bumps or gold bumps.

A reflective layer 22 prevents light from escaping the device outside an area that matches the etendue-limit of a lens in the optical system. The semiconductor layers in an LED are typically quite transparent to light at the emission wavelength. Thus, a light ray 30 which would normally escape substrate 25 outside the etendue-limit of lens 12 is reflected off reflective layer 22, transmitted through layers 26, 28, and 32 without absorption, then reflected off reflective contact 34 until ray 30 escapes substrate 25 in region 24, the region of the surface of the light emitting diode that is not covered by reflective layer 22. Reflective layer 22 and reflective contacts 34 and 35 create an optical cavity where light generated from active region 28 outside the etendue-limit of lens 12 is reflected back and forth until the light reaches region 24, where it can be utilized by lens 12.

In one embodiment, reflective layer 22 may be, for example, a metal having a reflectivity greater than 90%. Optical modeling has demonstrated that using a metal having a reflectivity greater than 98% yields up to a 50% gain in light collected by the optical system. Examples of suitable metals are as silver, aluminum, rhodium, and gold. The reflective metal may be selected based on the material on which it is to be deposited, or the wavelength of the light it is to reflect. For example, gold is highly reflective of light in the red or infra-red wavelength ranges.

In another embodiment, reflective layer 22 may be, for example, a non-specular (white) highly-reflective layer. One example of a suitable material is a white powder or paint containing barium sulfate, such as White Reflectance Coatings available from Munsell Color Services of New Windsor, N.Y. The non-specular layer may be applied by, for example, painting or electrophoretic deposition.

Figure 4:
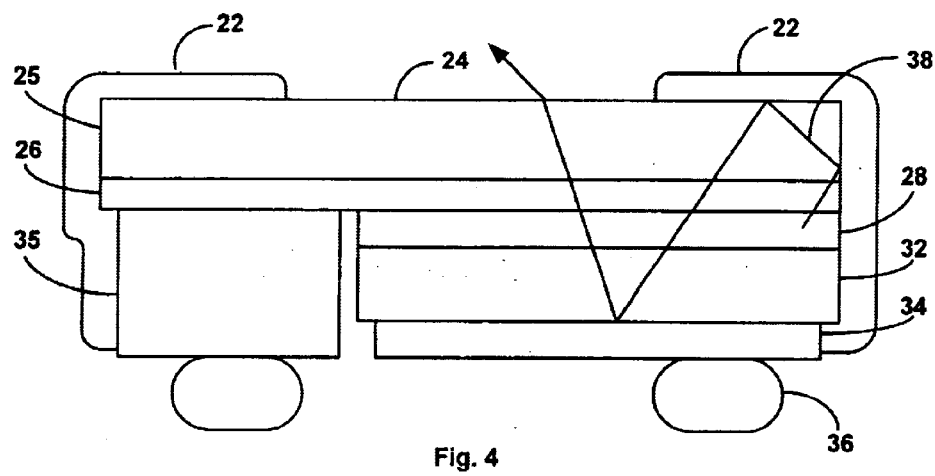
FIG. 4 illustrates a cross sectional view of an alternate embodiment of a light emitting device including a reflective layer that covers both the sides as well as a portion of the top of the chip.

FIG. 4 illustrates an alternative embodiment of the invention, where reflective layer 22 extends down over the sides of the light emitting diode. A ray of light 38 which would normally be emitted out the side of the light emitting diode is reflected off reflective layer 22 on the side of the device, then reflected off reflective layer 22 on the top of the light emitting diode, then reflected off reflective contact 34 until it escapes through substrate 25 in region 24. In embodiments where reflective layer 22 is insulating, such as when reflective layer 22 is a non-specular paint layer, reflective layer 22 may be deposited directly on the sides of the light emitting diode. In embodiments where reflective layer 22 is conducting, such as when reflective layer 22 is a reflective metal, a dielectric layer must first be deposited over the sides of the light emitting diode, to prevent reflective layer 22 from creating a short between the layer of first conductivity type and the layer of second conductivity type. Alternatively, if reflective layer 22 is conducting, it may cover only part of the sides of the light emitting diode such as the sides of substrate 25, so as not to create a short.

Different materials may be used to create reflective layer 22 in different areas on the light emitting diode. For example, a reflective metal may be used on the top of the diode, while an insulating non-specular material may be used on the sides of the diode.

Figure 5:
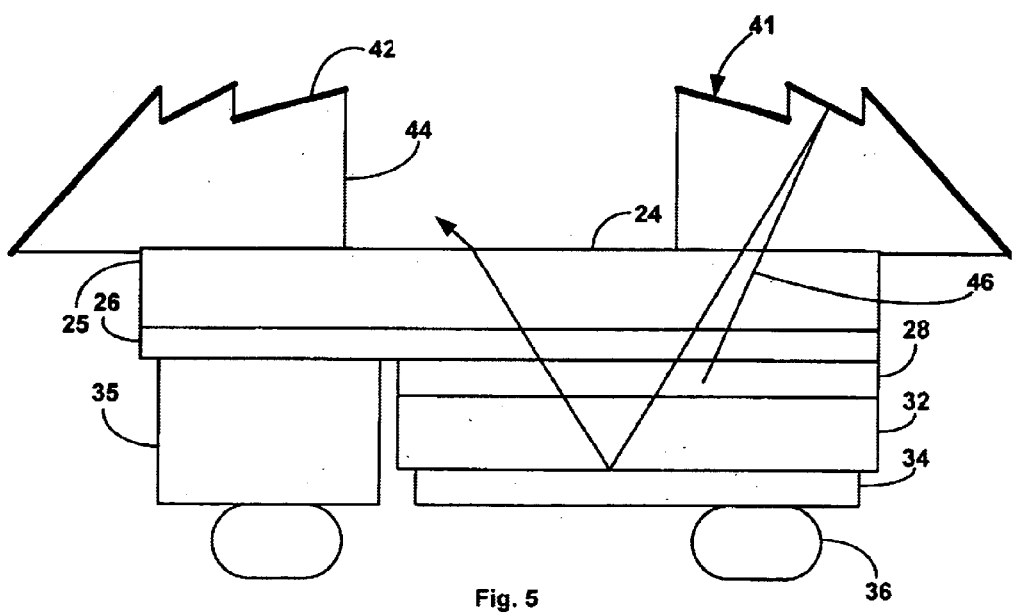
FIG. 5 illustrates a cross sectional view of a light emitting device including an optical element, according to an embodiment of the present invention.

FIG. 5 illustrates a device with an optical structure 41 bonded to the light emitting diode. The top of optical structure 41 is shaped to reflect light emitted outside the etendue-limit of an optical system back into the device, such that it can be extracted from region 24. Optical structure 41 includes a transparent material 44, and a reflective layer 42 formed over some edges of transparent material 44. Reflective layer 42 may be, for example, a reflective metal such as those described above in the text accompanying FIG. 3. Transparent material 44 may be index-matched to the adjacent material, substrate 25 in FIG. 5. A light ray 46 outside the etendue-limited area (region 24) is transmitted through transparent material 44, then reflected off reflective layer 42. Light ray 46 reenters the device, where it is reflected off contact 34, then escapes substrate 25 in region 24. Optical structure 41 may be used in conjunction with reflective layer 22, shown in FIGS. 2–4. For example, optical structure 41 may be used on the top surface of the device, while a reflective layer 22 is used on the sides of the device.

Figure 6:
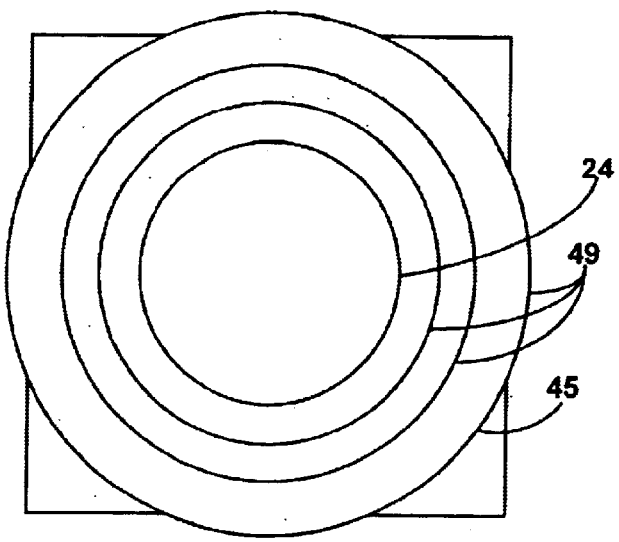
FIG. 6 illustrates a top view of the device shown in FIG. 5.

FIG. 6 illustrates a top view of the device shown in FIG. 5. Three concentric circles 49 correspond to the ends of portions of reflective layer 42 of optical structure 41, shown in FIG. 5. Note the light-escape area 24 need not be circular. Light-escape area 24 may be square, rectangular, oval, or any other shape. For example, if the light from the device is to be coupled into a long, thin lightguide, light-escape area 24 may be long and thin. The boundary of the light emitting diode is shown by reference 45.

Figure 8:
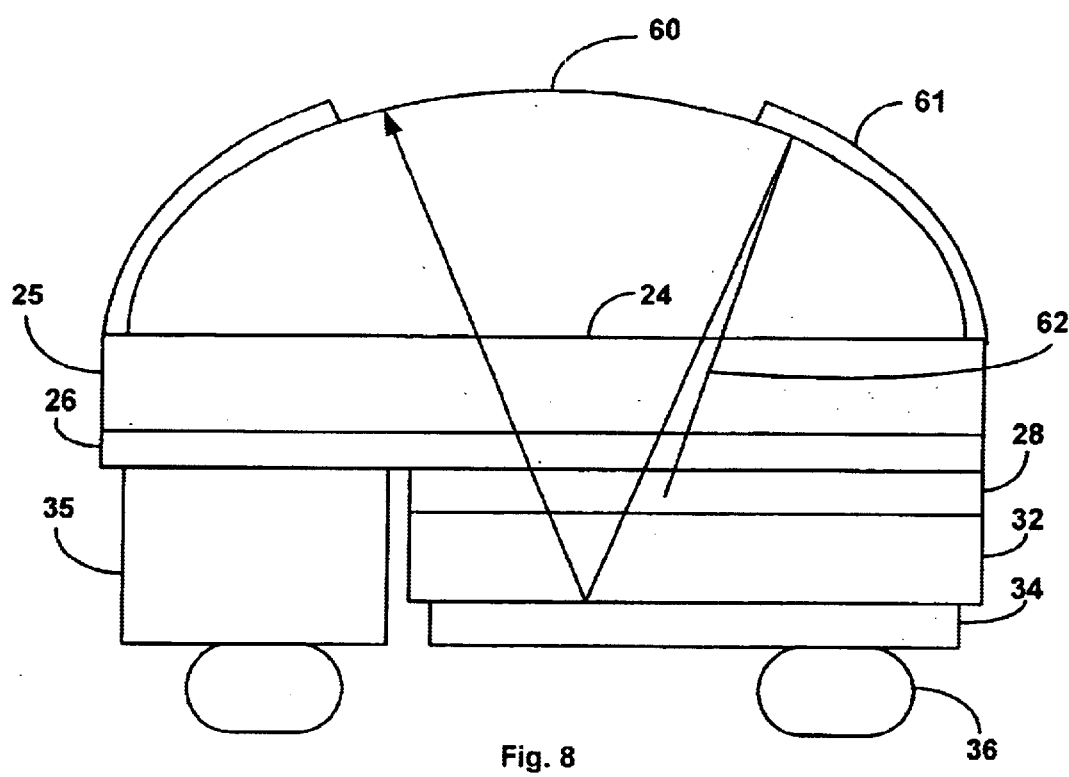
FIG. 8 illustrates a cross sectional view of a light emitting device including a dome, according to an embodiment of the present invention.

FIG. 8 illustrates a cross sectional view of a device with an alternative optical structure, including a transparent dome 60. Portions of dome 60 are covered by a reflective material 61 such that light is only emitted from dome 60 in the light-escape area 24. The device shown in FIG. 8 differs from the device shown in FIG. 5 in that dome 60 covers light-escape area 24, while optical structure 41 of FIG. 5 has a hole corresponding to light-escape area 24. As is clear to one of skill in the art, any suitable optical structure may be used according to embodiments of the invention, not just the dome structure shown in FIG. 8 or the fresnel-like structure shown in FIG. 5.

Figure 7:
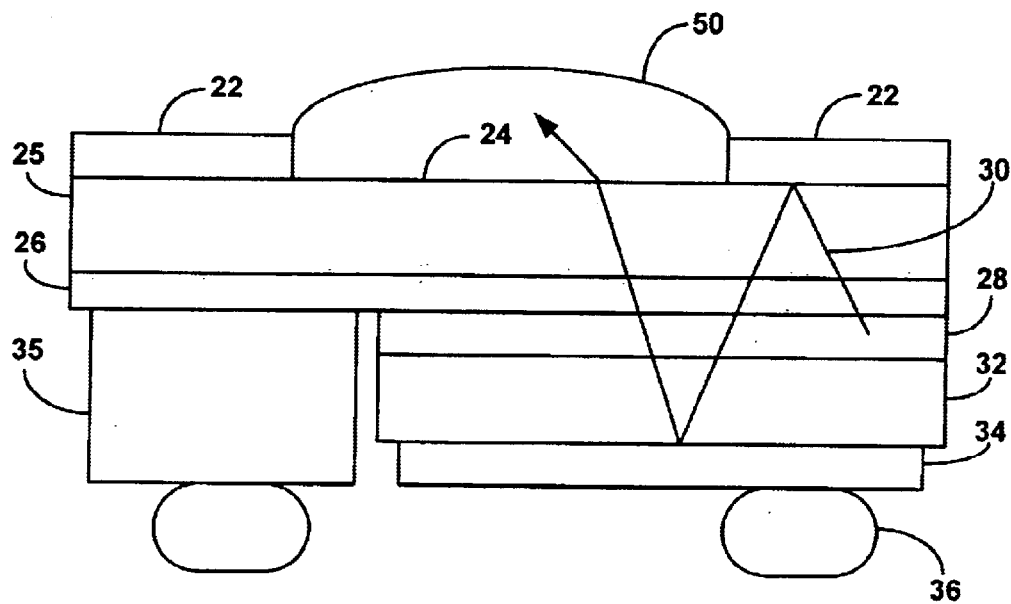
FIG. 7 illustrates a cross sectional view of a light emitting device including a fluorescent material, according to an embodiment of the present invention.

FIG. 7 illustrates an embodiment of the invention where a wavelength-converting material is deposited over light-escape area 24. Material 50 may be, for example, a fluorescent material such as phosphor deposited over the region of substrate 25 that is left exposed by reflective layer 22. Though FIG. 7 shows material 50 deposited over the device illustrated in FIG. 3, any of the other embodiments described above may be combined with wavelength-converting material 50. If active region 28 is III-nitride such that the emission from active region 28 is blue, material 50 may be a Ce-doped Yttrium Aluminum Garnet (YAG) phosphor, which absorbs blue emission and emits yellow light. Yellow light from material 50 may mix with blue light from active region 28 such that the light from region 24 appears as an intense white light source.

Figure 10:
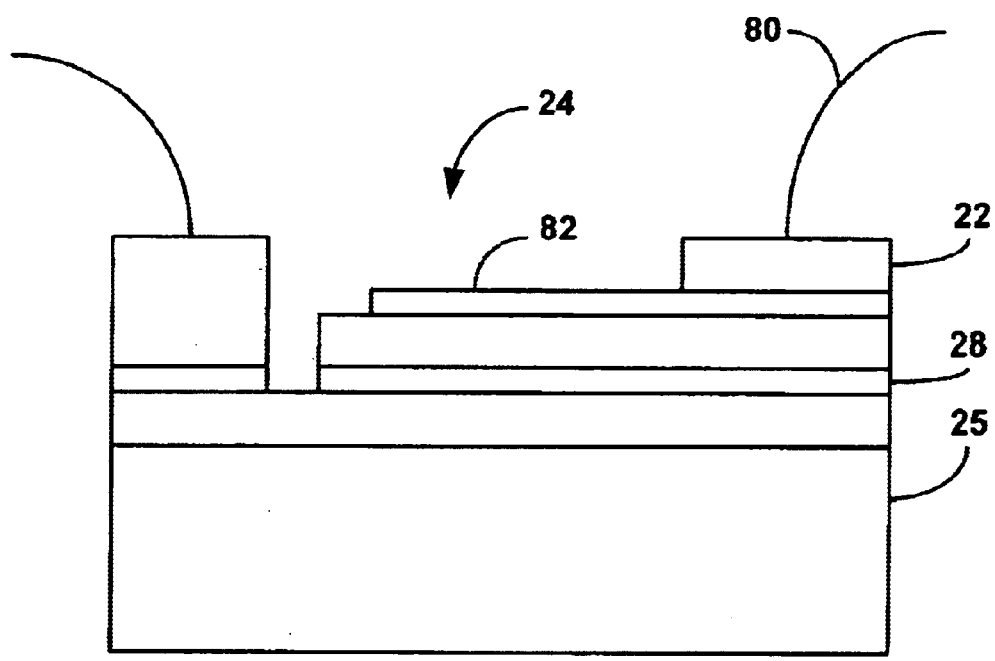
FIG. 10 illustrates a cross sectional view of an alternate embodiment of a light emitting device.

FIG. 10 illustrates an embodiment of the invention where the light emitting diode is an epitaxy-up device instead of a flip chip device. The device shown in FIG. 10 has transparent contacts 82 instead of reflective contacts. Light is extracted through the contacts. In the embodiment illustrated in FIG. 10, reflective material 22 is a metal, to which wire bonds 80 are connected for making electrical contact to transparent contacts 82. The bottom of substrate 25 may be coated with a reflective material (not shown).

Figure 9:
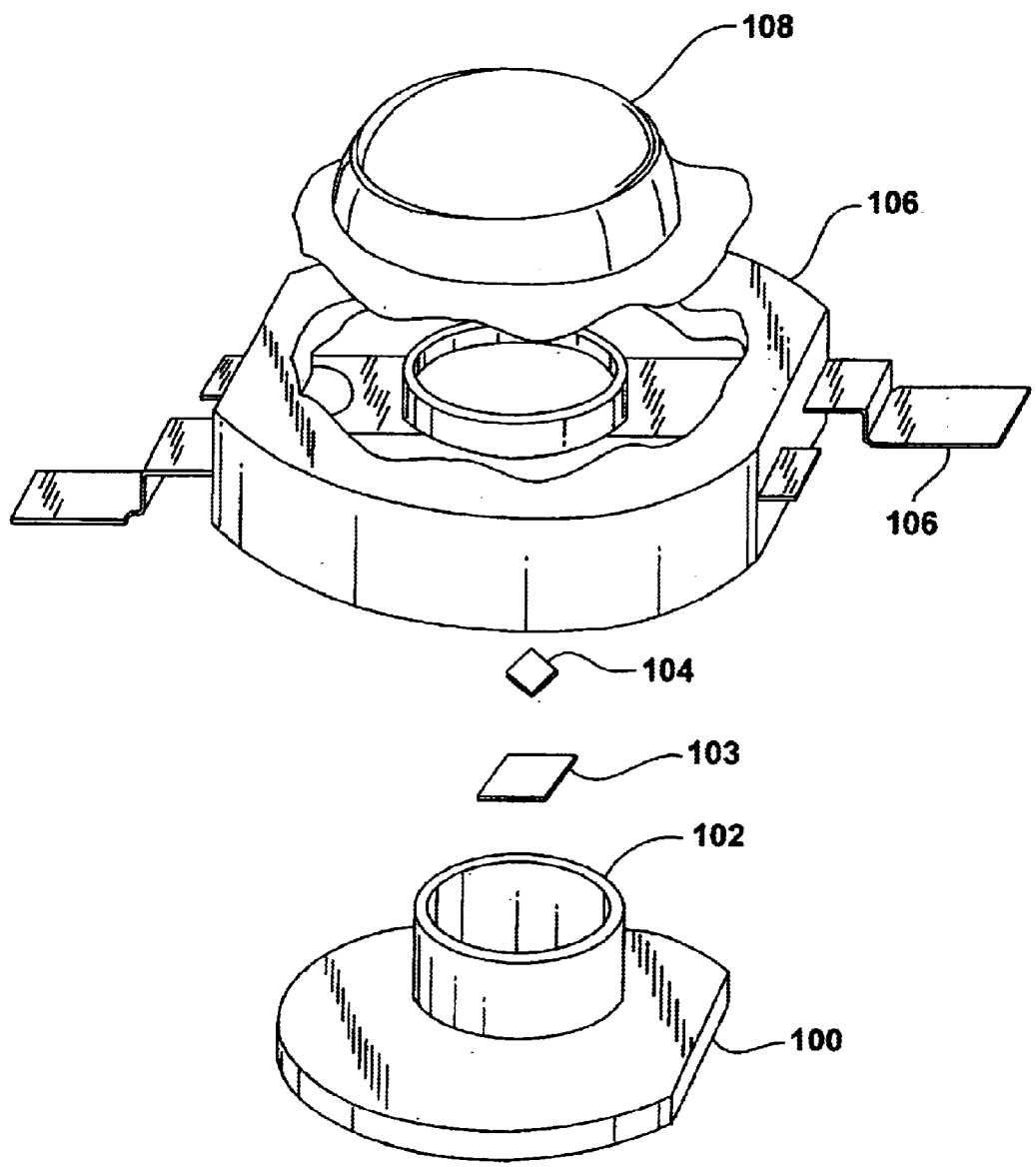
FIG. 9 illustrates an exploded view of a packaged light emitting device.

FIG. 9 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Figure 11A:
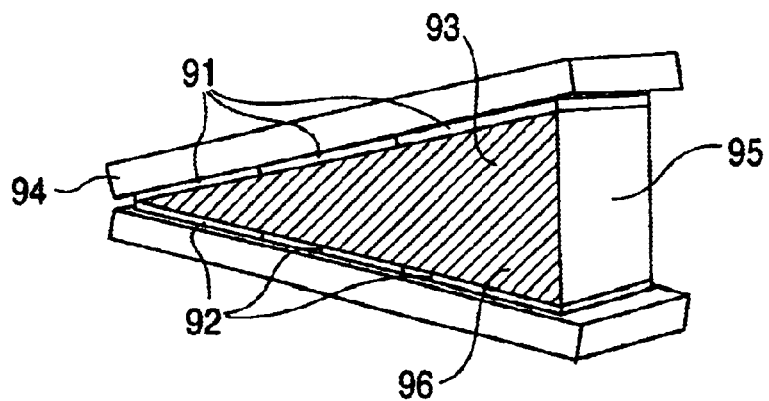
FIGS. 11A and 11B illustrate a device with LEDs disposed on the sides of a transparent wedge.
Figure 11B:
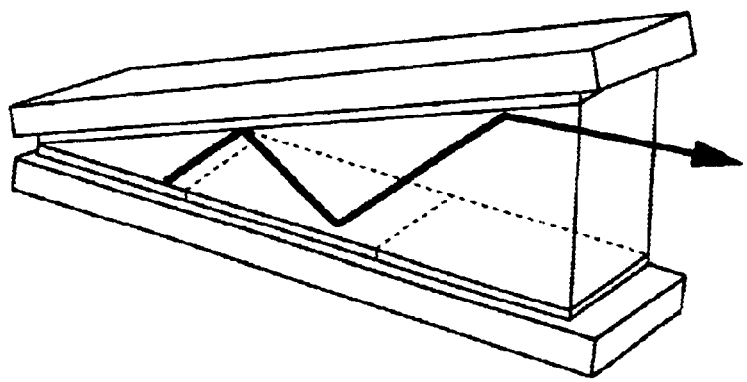

FIGS. 11A and 11B illustrate another device for directing light emitted by a source into the etendue-limit of an optical system. The device of FIG. 11A has multiple light sources 91 and 92 disposed along the edges of a transparent wedge 96. Wedge 96 may be, for example, sapphire, glass, acrylic, silicone, or any other suitable material capable of maintaining transparency when exposed to the light and heat emitted by light sources 91 and 92. The light sources may be LEDs mounted on submounts 94 and attached to the wedge by, for example, gluing, pressing, or bonding. The size and shape of an exit surface 95 of transparent wedge 96 is selected to correspond to the etendue-limit of an optical system (not shown). The sides of the wedge with LEDs need not be completely covered with LEDs. Portions of the sides not covered with LEDs may be coated with a reflective coating. The sides of the wedge without LEDs may also be coated with a reflective coating 93. The coated sides 93 and LEDs 91 and 92 create a tapered cavity with only one opening, the exit surface. Since the semiconductor layers and substrate in LEDs 91 and 92 are transparent to the emitted light, the light is reflected off sides 93 and the reflective contacts of LEDs 91 and 92 until the light exits the exit surface, as illustrated in FIG. 11B. The shape of the wedge directs all light to the exit surface. In some embodiments, exit surface 95 has the same dimensions as a single LED, though it may be larger or smaller.

A wedge with eight perfectly reflective LEDs and an exit surface the same size as a single LED produces eight times more light in the same area as a single LED. Real devices are generally not perfectly reflective. A wedge with eight LEDs that are 85% reflective will produce four to five times more light in the same area as a single LED.

The wedge device illustrated in FIGS. 11A and 11B may be suitable as a source in many applications requiring high brightness, including, for example, projectors, car headlights, fiber optics, and theater lights. Homogeneous illumination of the exit surface makes the wedge particularly suitable to projection applications. The size and shape of the exit surface of the wedge may be tailored to individual applications.

Figure 12:
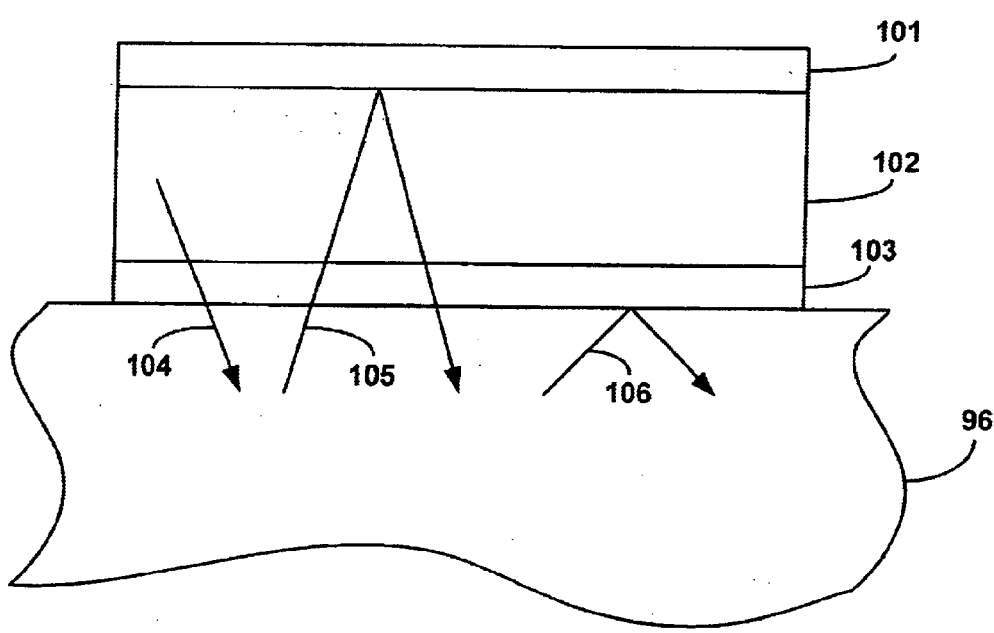
FIG. 12 illustrates a red LED disposed on a side of a transparent wedge with a dichroic filter.

In some embodiments, LEDs of different colors are mounted on the edges of wedge 96, such that the light emitted from the exit surface is a mixture of the different colors. For example, red, blue, and green LEDs may be used such that the mixed light exiting the exit surface appears white. Red LEDs are generally not very reflective of blue and green light. Thus, a dichroic materal may be used in embodiments including red LEDs, as illustrated in FIG. 12. A red flip chip LED 102 with a reflective contact 101 is mounted on wedge 96 with a dichroic filter 103 between the LED and the wedge. Red light 104 emitted from the active region of LED.102 passes through dichroic filter 103. Red light 105 inside the wedge passes through dichroic filter 103, is reflected off contact 101, then passes through dichroic filter 103 again to reenter the wedge. Blue or green light 106 is reflected by dichroic filter 103. The dichroic material is selected to reflect blue and green light and to transmit red light.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A light emitting device comprising:

a substrate having a first surface and a second surface opposite the first surface;

a region of first conductivity type overlying the first surface of the substrate;

an active region overlying the region of first conductivity type;

a region of second conductivity type overlying the active region; and a reflective material overlying a portion of the second surface of the substrate, the reflective material surrounding an aperture through which light exits the device;

wherein the substrate is transparent to light emitted by the active region.

2. A light emitting device comprising:

a substrate having a first surface, a second surface opposite the first surface, and a first side substantially perpendicular to the second surface;

a region of first conductivity type overlying the first surface of the substrate;

an active region overlying the region of first conductivity type;

a region of second conductivity type overlying the active region;

a reflective material overlying a portion of the second surface of the substrate, the reflective material surrounding an aperture through which light exits the device; and a reflective material covering a portion of the first side.

3. The light emitting device of claim 2 wherein the reflective material covering the portion of the substrate is the same as the reflective material covering a portion of the first side.

4. The light emitting device of claim 2 wherein the reflective material covering the portion of the substrate is a different material from the reflective material covering a portion of the first side.

5. The light emitting device of claim 1 wherein the reflective material is a metal.

6. The light emitting device of claim 5 wherein the metal has a reflectance greater than 90%.

7. The light emitting device of claim 5 wherein the metal is selected from the group consisting of silver, gold, aluminum, and rhodium.

8. The light emitting device of claim 1 wherein the reflective material is a non-specular (white) layer.

9. The light emitting device of claim 8 wherein the non-specular layer comprises barium sulfate.

10. The light emitting device of claim 8 wherein the non-specular layer is insulating.

11. The light emitting device of claim 1 further comprising an optical system positioned near the second surface of the substrate.

12. The light emitting device of claim 11 wherein the portion of the substrate covered by the reflective material is outside an area corresponding to an etendue-limit of the optical system.

13. A light emitting device comprising:
a substrate having a first surface and a second surface opposite the first surface;
a region of first conductivity type overlying the first surface of the substrate;
an active region overlying the region of first conductivity type;
a region of second conductivity type overlying the active region;
a reflective material overlying a portion of the second surface of the substrate, the reflective material surrounding an aperture through which light exits the device;
wherein the reflective material is separated from the substrate by a transparent material.

14. The light emitting device of claim 13 wherein the transparent material comprises a dome.

15. The light emitting device of claim 13 wherein the transparent material comprises a fresnel lens.

16. The light emitting device of claim 13 wherein:
the substrate has a first index of refraction;
the transparent material has a second index of refraction; and
the second index of refraction is greater than or equal to the first index of refraction.

17. A light emitting device comprising:
a substrate having a first surface and a second surface opposite the first surface;
a region of first conductivity type overlying the first surface of the substrate;
an active region overlying the region of first conductivity type;
a region of second conductivity type overlying the active region;
a reflective material overlying a portion of the second surface of the substrate, the reflective material surrounding an aperture through which light exits the device;
wherein a portion of the substrate not covered by the reflective material is covered by a wavelength converting material.

18. The light emitting device of claim 17 wherein the wavelength converting material is a phosphor.

19. The light emitting device of claim 1 wherein the aperture is located substantially in a center of the device.

20. The light emitting device of claim 1 wherein the aperture is one of circular and rectangular.

21. The light emitting device of claim 1 wherein light exiting from the aperture comprises the primary light output of the device.

* * * * *

UNITED STATES PATENT AND TRADEMARK OFFICE
CERTIFICATE OF CORRECTION

PATENT NO.        : 6,730,940 B1
APPLICATION NO. : 10/283737
DATED             : May 4, 2004
INVENTOR(S)       : Frank M. Steranka and Daniel A. Steigerwald It is certified that error appears in the above-identified patent and that said Letters Patent is hereby corrected as shown below:

On the Title of the patent at numeral (75): Delete inventor Matthijs H. Keuper, San Jose, CA (US)

Signed and Sealed this

Fifth Day of September, 2006

JON W. DUDAS
*Director of the United States Patent and Trademark Office*